(12) United States Patent
Matsuda

(10) Patent No.: US 7,709,833 B2
(45) Date of Patent: May 4, 2010

(54) ORGANIC LIGHT-EMITTING DEVICE

(75) Inventor: Yojiro Matsuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 11/762,383

(22) Filed: Jun. 13, 2007

(65) Prior Publication Data

US 2007/0296334 A1 Dec. 27, 2007

(30) Foreign Application Priority Data

Jun. 23, 2006 (JP) ............................. 2006-173250
May 31, 2007 (JP) ............................. 2007-144667

(51) Int. Cl.
*H01L 51/00* (2006.01)
(52) U.S. Cl. .................. 257/40; 257/E51.022
(58) Field of Classification Search .................. 257/13, 257/40, 918, 79–103, E51.022; 438/35
See application file for complete search history.

(56) References Cited

U.S. PATENT DOCUMENTS

| 6,013,384 | A | | 1/2000 | Kido et al. .................. 428/690 |
|---|---|---|---|---|
| 6,541,130 | B2 | | 4/2003 | Fukuda ........................ 428/690 |
| 6,589,673 | B1 | * | 7/2003 | Kido et al. ................... 428/690 |
| 7,259,514 | B2 | * | 8/2007 | Murayama et al. .......... 313/506 |
| 2007/0029539 | A1 | * | 2/2007 | Yashima et al. ............... 257/13 |
| 2007/0228948 | A1 | * | 10/2007 | Miura ........................ 313/506 |

FOREIGN PATENT DOCUMENTS

| JP | 10-270171 | 10/1998 |
|---|---|---|
| JP | 2000-323277 | 11/2000 |
| JP | 2001-85163 | 3/2001 |
| JP | 2003-31363 | 1/2003 |
| JP | 2004-132189 | 4/2004 |

* cited by examiner

*Primary Examiner*—W. David Coleman
*Assistant Examiner*—Daniel Shook
(74) *Attorney, Agent, or Firm*—Fitzpatrick, Cella, Harper & Scinto

(57) ABSTRACT

Provided is an organic light-emitting device in which light extraction efficiency for the luminescent color of each of organic light-emitting elements can be improved without an increase in driving voltage and a reduction in emission efficiency. The organic light-emitting elements for respective luminescent colors are different from each other in thickness of an electron injection layer, and the concentration of a metal or a metal compound in an electron injection layer is adapted to increase as the thickness of the electron injection layer decreases.

12 Claims, 3 Drawing Sheets

ORGANIC LIGHT-EMITTING DEVICE

BACKGROUND OF THE INVENTION

1. Field of the Invention

The present invention relates to an organic light-emitting device to be used in, for example, a flat panel display, a projection display, or a printer.

2. Description of the Related Art

Organic light-emitting elements (organic EL elements or organic electroluminescence elements) have been actively researched and developed these days. It has been known that an aluminum-lithium alloy or a magnesium-silver alloy is used in the cathode of any such organic light-emitting element in order that electron injection efficiency may be improved. It has been also known that an extremely thin layer (having a thickness of 5 to 10 Å) of a dielectric substance such as lithium, lithium fluoride, magnesium oxide, or potassium fluoride is inserted into an electron injection layer in contact with the cathode.

Japanese Patent Application Laid-Open No. H10-270171 discloses a constitution in which an electron injection layer (having a thickness of 10 to 3,000 Å) having a metal capable of functioning as a donor (electron-donating) dopant is provided in contact with a cathode. Examples of a disclosed metal to be used as the donor dopant include alkali metals, alkali earth metals, and transition metals including rare earth elements.

Japanese Patent Application Laid-Open No. H10-270172 discloses a constitution in which an electron injection layer (having a thickness of 10 to 2,000 Å) having a metal oxide or a metal salt as a dopant is provided in contact with a cathode.

Meanwhile, efforts have been made to improve the light extraction efficiency of an organic light-emitting element. Japanese Patent Application Laid-Open No. 2000-323277 discloses a constitution in which an organic compound layer contacting with from an organic light-emitting layer to a metal electrode is formed so as to have such a thickness that an optical distance from a light-emitting interface to an interface between the organic compound layer and the metal electrode is substantially equal to an odd multiple of ¼ of the wavelength of emitted light. Such constitution maximizes light interference between the emitted light and returned light by reflection on the metal electrode, thereby improving light extraction efficiency.

Japanese Patent Application Laid-Open No. 2004-132189 discloses a constitution in which an organic compound layer is formed so as to have such a thickness that an optical distance between an anode and a cathode is equal to an integral multiple of ½ of the wavelength of emitted light. Such constitution provides a resonator structure in which light beams reflected between the anode and the cathode intensify each other, thereby improving light extraction efficiency.

In a conventional constitution using a single layer of an electron injection material such as lithium fluoride (LiF) or potassium fluoride (KF) as an electron injection layer, a thickness capable of electron injection is extremely small, specifically, 5 to 10 Å, so that it has been difficult to improve light extraction efficiency by controlling the thickness of the electron injection layer. On the other hand, in the case of an electron injection layer obtained by doping an organic compound with an electron injection material, a thickness capable of electron injection is 50 to 3,000 Å.

However, extensive studies made by the inventors of the present invention have shown that, even in the case of an electron injection layer obtained by doping an organic compound with an electron injection material, electron injection efficiency reduces with decreasing thickness of the layer, with the result that the voltage at which a light-emitting element is driven increases. Further, a reduction in emission efficiency has occurred as a result of the loss of the optimum carrier balance in some cases. For example, there arises the following problem: when the thickness of the electron injection layer of an organic light-emitting element capable of emitting blue light having a short wavelength is reduced for improving the light extraction efficiency of the element, an increase in driving voltage of the element and a reduction in emission efficiency occurs.

The present invention provides an organic light-emitting device including a plurality of organic light-emitting elements different in luminescent color from each other, in which light extraction efficiency for the luminescent color of each organic light-emitting element can be improved without an increase in driving voltage of the element and a reduction in emission efficiency.

SUMMARY OF THE INVENTION

In order to solve the above-mentioned problems, the present invention provides an organic light-emitting device including: a substrate; and a plurality of organic light-emitting elements provided on the substrate, the plurality of organic light-emitting elements including a first organic light-emitting element that emits light having a first luminescent color and a second organic light-emitting element that emits light having a second luminescent color different from the first luminescent color, wherein the first and second organic light-emitting elements each include a cathode, an anode, an organic light-emitting layer formed between the cathode and the anode, and an electron injection layer formed between the cathode and the light-emitting layer to be in contact with the cathode, and the electron injection layer includes an organic compound and an electron injection dopant material; and wherein a thickness of the electron injection layer in the first organic light-emitting element is thinner than a thickness of the electron injection layer in the second organic light-emitting element, and a concentration of the electron injection dopant material in the first organic light-emitting element is higher than a concentration of the electron injection dopant material in the second organic light-emitting element.

In the present invention, each light extraction efficiency of organic light-emitting elements for respective colors can be improved without an increase in driving voltage of the element and a reduction in emission efficiency by controlling the thickness of the electron injection layer of the element and the concentration at which the electron injection layer is doped with an electron injection material.

In other words, when only the thickness of each of the hole transport layer, organic light-emitting layer, electron transport layer, and electron injection layer of an organic light-emitting element is controlled as in the case of the conventional technique, electrical characteristics (such as a driving voltage and emission efficiency) may be degraded even though optical light extraction efficiency can be improved. In contrast, according to the present invention, optical characteristics can be optimized on the basis of the thickness of an electron injection layer, and, furthermore, electrical characteristics can be optimized on the basis of the concentration at which the electron injection layer is doped with an electron injection material.

Further features of the present invention will become apparent from the following description of exemplary embodiments with reference to the attached drawings.

DESCRIPTION OF THE EMBODIMENTS

Figure 1:
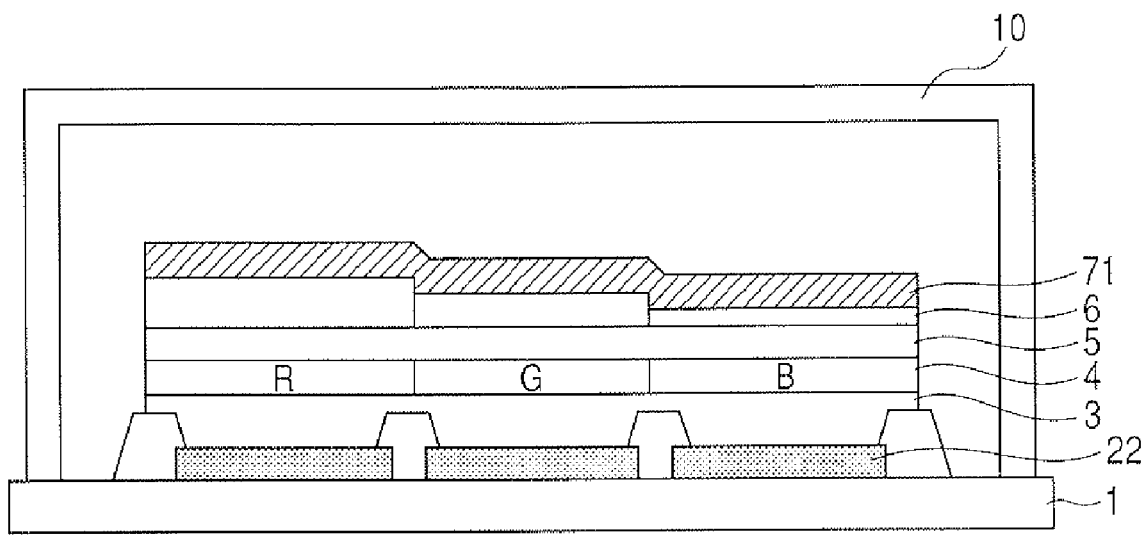
FIG. 1 is a schematic sectional view of an organic light-emitting device according to Example 1 of the present invention.

An organic light-emitting device according to the present invention includes a substrate and a plurality of organic light-emitting elements provided on the substrate, and the plurality of organic light-emitting elements include a first organic light-emitting element that emits light having a first luminescent color and a second organic light-emitting element that emits light having a second luminescent color different from the first luminescent color. For example, an arbitrary luminescent color can be selected for each of the first and second luminescent colors. Arbitrary colors may be combined, and examples of a possible combination include a combination of a red color and a blue color, a combination of a white color and a green color, and a combination of a blue color and an orange color. In addition, when full-color light beams are to be emitted by combining a plurality of luminescent colors, the plurality of organic light-emitting elements preferably include a third organic light-emitting element that emits light having a third luminescent color different from the first and second luminescent colors. In this case, the combination of the luminescent colors has three colors of red, green and blue. The following embodiment shows a constitution having organic light-emitting elements for three luminescent colors, that is, a red color, a green color and a blue color. However, the present invention is not limited to the combination.

In addition, each organic light-emitting element includes a cathode, an anode, an organic light-emitting layer formed between the cathode and the anode, and an electron injection layer formed between the cathode and the organic light-emitting layer to be in contact with the cathode. The electron injection layer has an organic compound and an electron injection dopant material. The electron injection dopant material is an electron injection material with which the organic compound is doped. In other words, the layer is formed mainly of the organic compound, and the organic compound is doped with a small amount of the electron injection dopant material. The concentration at which the organic compound is doped with the electron injection dopant material is preferably in the range of 1 wt % or more to 30 wt % or less. A concentration in the range can improve electron injection efficiency and suppress the driving voltage of the element.

In addition, the organic light-emitting device of the present invention is characterized in that the thickness of the electron injection layer in the first organic light-emitting element is thinner than the thickness of the electron injection layer in the second organic light-emitting element. In addition, the device is characterized in that the concentration of the electron injection dopant material in the first organic light-emitting element is higher than the concentration of the electron injection dopant material in the second organic light-emitting element.

Hereinafter, an embodiment of the organic light-emitting device of the present invention will be described with reference to FIG. 1.

Figure 2:
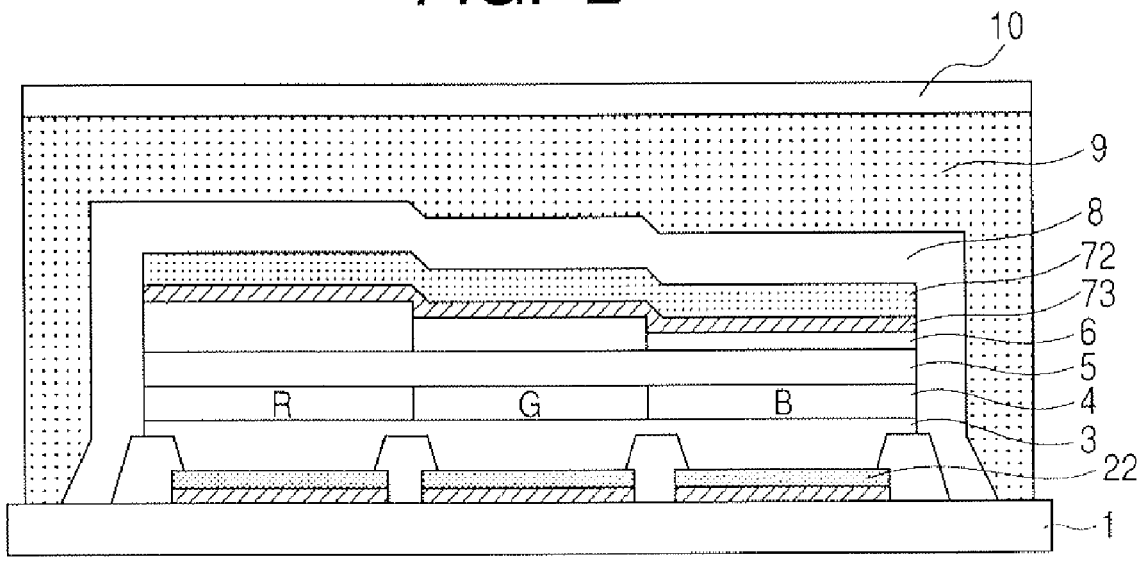
FIG. 2 is a schematic sectional view of an organic light-emitting device according to Example 2 of the present invention.

An organic light-emitting device shown in FIG. 1 has a constitution in which a transparent anode 22, a hole transport layer 3, an organic light-emitting layer 4, an electron transport layer 5, an electron injection layer 6, and a reflective cathode 71 are provided in the stated order on a substrate 1. The organic light-emitting layer 4 is separated into an organic light-emitting layer 41 for emitting red (R) light, an organic light-emitting layer 42 for emitting green (G) light, and an organic light-emitting layer 43 for emitting blue (B) light in correspondence with red, green and blue luminescent colors. The reflective cathode 71 is provided on the organic light-emitting layers so that a constitution ranging from the anode to the cathode constitutes organic light-emitting elements. By supplying a current into each of the organic light-emitting elements, a hole is injected from the anode 22 and an electron is injected from the cathode 71 and they are recombined in the organic light-emitting layer 4 to emit light. Then, a glass member 10 as a sealing member is placed above the organic light-emitting elements. The glass member 10 may be a member having a cavity at a position corresponding to a position above the organic light-emitting elements as shown in FIG. 1, or may be a flat glass plate as shown in FIG. 2 to be described later. In addition, a gap may be provided between each organic light-emitting element and a sealing member as shown in FIG. 1, or a resin 9 may be formed between them as shown in FIG. 2.

An example of a constitution in which the anode 22 is formed on the substrate 1 has been shown in this embodiment, but the present invention is not limited to this embodiment. The cathode, the organic compound layers (the hole transport layer, the organic light-emitting layer, the electron transport layer, and the electron injection layer), and the anode may be constituted in the stated order from the side of the substrate 1, and the selection of an electrode and the order in which layers are stacked in an organic light-emitting element are not particularly limited; provided that the case where the anode, the organic compound layers, and the cathode are constituted in the stated order from the side of the substrate 1 is preferable for the adjustment of the thickness of the electron injection layer for adjusting a light extraction efficiency and a luminescent chromaticity because the electron injection layer is an organic compound layer to be finally formed. Such order is particularly preferable when the organic compound layers are each formed by vapor deposition or an ink jet method because a relatively large thickness error occurs. In addition, in this embodiment, a bottom emission type light-emitting device in which emitted light is extracted from the side of the substrate 1 has been shown; the present invention is applicable also to a top emission type light-emitting device in which emitted light is extracted from an upper electrode opposite to the substrate 1.

An electrode of the present invention is not particularly limited, but it can include a transparent electrode, a reflective electrode and a semi-transparent reflective electrode, and can be formed of an oxide conductive film of ITO, IZO, or the like, or a film of a metal such as gold, platinum, silver, aluminum or magnesium, or an alloy thereof, a multi-layer including these films. For example, in the organic light-emitting device shown in FIG. 1, ITO (having a thickness of 120 nm) is used in the transparent anode 22, and aluminum (having a thickness of 150 nm) is used in the reflective cathode 71. In the case of a semi-transparent reflective electrode, a thin film (having a thickness of 10 nm to 30 nm) made of a metal such as gold, platinum, silver, aluminum, or magnesium, or an alloy thereof is preferably used.

An organic layer (mixed layer) obtained by incorporating an electron injection material capable of functioning as a donor (electron-donating) dopant into an organic compound is provided as the electron injection layer 6 of the present invention. A metal having a low work function, or a compound of the metal is preferably used as a dopant in order that electron injection efficiency may be improved. Preferable examples of the metal having a low work function include alkali metals, alkali earth metals, and rare earth elements. An alkali metal compound is preferable because the compound can be relatively easily handled in the air. An example of a preferable alkali metal compound is a cesium compound; cesium carbonate is stable in the air and can be easily handled. An electron transportable material is preferably used as the organic compound of the electron injection layer, and a known material such as an aluminum quinolinol complex or a phenanthroline compound can be used.

The above-mentioned characteristics of the present invention will be described in detail.

The present invention is characterized in an organic light-emitting device is formed such that the thicknesses of the electron injection layers 61, 62 and 63 differ from one another in correspondence with luminescent colors. The fact that the thicknesses of the electron injection layers differ from one another in correspondence with luminescent colors can improve light extraction efficiency for each luminescent color depending on the thickness of an electron injection layer.

In the organic light-emitting device shown in FIG. 1, the electron injection layers 61, 62 and 63 are each formed so as to have such a thickness that an optical distance between an interface of each of the organic light-emitting layers 41, 42 and 43 and the hole transport layer 3 and an interface of the reflective cathode 71 and the electron injection layer 6 is substantially equal to an odd multiple of ¼ of the emission wavelength of each of R, G and B. Further, the present invention is characterized in that the concentration of an electron injection material (an alkali metal compound in this embodiment) in an electron injection layer varies in correspondence with the thickness of the electron injection layer. Specifically, the present invention is characterized in that the smaller the thickness of an electron injection layer, the higher the concentration of an alkali metal compound in the electron injection layer.

Unlike the case where a single, thin electron injection layer (having a thickness of 5 to 10 Å) formed of, for example, lithium fluoride (LiF) or potassium fluoride (KF) is used, in the case where an electron injection layer obtained by doping an organic compound with an electron injection material is used, the thickness of the layer can be controlled in the range of 10 to 3,000 Å. However, investigation conducted by the inventor of the present invention has confirmed that electron injection efficiency tends to reduce by an amount corresponding to a reduction in thickness of an electron injection layer. In other words, electron injection property reduces depending on a reduction in thickness of an electron injection layer, whereby the driving voltage of a light-emitting element increases. Further, the optimum carrier balance is lost cause a reduction in emission efficiency. On the other hand, when thickness control is performed by the hole transport layer 3, the organic light-emitting layer 4, and the electron transport layer 5 as in the case of the conventional technique, electron and hole transport properties reduce by an amount corresponding to an increase in thickness of each of the layers, whereby the driving voltage of a light-emitting element increases. Further, the optimum carrier balance is lost to cause a reduction in emission efficiency.

In view of the above-mentioned problems, the inventor has conducted investigation. As a result, the inventor has found that optical characteristics can be optimized by the thickness of an electron injection layer, and, furthermore, electrical characteristics can be optimized by the concentration of an electron injection material in the electron injection layer. Specifically, a reduction in thickness of the electron injection layer reduces electron injection efficiency, but increasing the concentration of the electron injection material by an amount corresponding to the reduction in thickness can increase the electron injection efficiency. In contrast, when the thickness of the electron injection layer is increased, the optimum carrier balance can be maintained by reducing the concentration of the electron injection material. The concentration of the electron injection material can be determined by quantifying the amount of the material in the electron injection layer by ICP-MS analysis.

In the organic light-emitting device of the present invention, light extraction efficiency can be improved by employing either or both of the following two methods (1) and (2).

(1) One of the cathode and the anode has a reflective surface, and a thickness between the reflective surface and a light-emitting position in the organic light-emitting layer is set to intensify the luminescent color of each organic light-emitting element. In other words, an optical path difference is produced between the reflective surface and the light-emitting position, and light emitted from the organic light-emitting layer traveling directly toward the outside of the device interferes with light emitted from the organic light-emitting layer, reflecting on the reflective surface, and traveling toward the outside of the device, whereby emitted light is intensified. The term "reflective surface" refers not to reflection occurring at an interface between transparent members different from each other in refractive index but to a reflective surface having a high reflectivity of about 30% to 100% such as of a metal layer. The phrase "has a reflective surface" means that a constitution in which one electrode is an electrode formed of a single metal layer or a constitution having a metal layer and a transparent conductive layer on the organic light-emitting layer side of the metal layer is included. A constitution in which an insulating layer is formed between a transparent electrode and the metal layer is also permitted.

In order that emitted light may be intensified by interference, specifically, the organic compound layers are formed in such a manner that an optical distance d between the light-emitting position in the organic light-emitting layer 4 and the reflective surface of the reflective cathode 71, a peak wavelength $\lambda$ of the emission spectrum of the element, and a phase shift amount $\phi$ at the reflective surface satisfy the following equation 1. Such constitution maximizes light interference between emitted light and returning light as a result of reflection on the reflective cathode 71, thereby improving light extraction efficiency. When the respective luminescent colors are identical to each other in N representing an order of interference, the thickness of the electron injection layer of an organic light-emitting element having a short emission spectrum peak wavelength is preferably made small. The light-emitting position is determined depending on the hole mobility and electron mobility of a material for the organic light-emitting layer 4; most organic compounds to be used in the organic light-emitting layer 4 are each known to constitute a certain interface of the organic light-emitting layer 4.

$$2d/\lambda + \phi/2\pi = N \text{(integer)} \qquad \text{(Equation 1)}$$

(2) One of the cathode and the anode has a reflective surface, and the other has a semi-transparent reflective surface, and a thickness between the reflective surface and the semi-transparent reflective surface is set to intensify the luminescent color of each organic light-emitting element. In other words, an optical path difference is produced between the reflective surface and the semi-transparent reflective surface, and light transmitting through the semi-transparent reflective surface toward the outside of the device interferes with light reflected on the semi-transparent reflective surface and on the reflective surface and then transmitting through the semi-transparent reflective surface to travel toward the outside of the device, whereby emitted light is intensified. The term "semi-transparent reflective surface" refers to a reflective surface formed of a metal thin film (having a thickness of 10 nm to 30 nm) and having the property with which a part of light is transmitted and the other part of the light is reflected. The phrase "has a semi-transparent reflective surface" means that a constitution in which one electrode is an electrode formed of a single metal thin film or a constitution having a metal thin film and a transparent conductive layer is included. A constitution in which an insulating layer is formed between the metal thin film and the transparent conductive layer is also permitted.

In order that emitted light may be intensified by interference, specifically, the organic compound layers are formed in such a manner that an optical distance D between the semi-transparent reflective surface of the transparent anode 22 and the reflective surface of the reflective cathode 71, an emission wavelength λ of the element, a phase shift amount φ1 at the semi-transparent reflective surface, and a phase shift amount φ2 at the reflective surface satisfy the following equation 2. Such constitution provides a resonator structure in which light beams reflected between the transparent anode 22 and the reflective cathode 71 intensify each other, thereby improving light extraction efficiency.

$$2D/\lambda+(\phi1+\phi2)/2\pi=N(\text{integer}) \quad \text{(Equation 2)}$$

Incidentally, in an actual organic light-emitting device, in consideration of, for example, a view angle characteristic in a trade-off relationship with the extraction efficiency of a front face, the thickness of each layer is not necessarily needed to be made to coincide with that described above.

In the present invention, the organic compound layers may include another layer such as an electron transport layer or a hole transport layer in addition to the organic light-emitting layer and the electron injection layer as in the case of the above-mentioned embodiment. Even when the layers have another layer as described above, light extraction efficiency can be improved by adjusting the thickness of the electron injection layer for each luminescent color, whereby the thickness of the other layer can be kept constant irrespective of a luminescent color. When the thickness of the electron transport layer or the hole transport layer is kept constant, such layer can be formed so as to straddle organic light-emitting elements different from each other in luminescent color to be common to the elements, so that a production process for the organic light-emitting device of the present invention can be significantly simplified. In addition, a difference in driving voltage between organic light-emitting elements for the respective colors can be reduced by making the thickness of the electron transport layer or hole transport layer having a resistance larger than that of the electron injection layer constant. A small difference in driving voltage is particularly preferable in an active matrix type organic light-emitting device. The reason for the foregoing is as follows: a thin-film transistor controlling for the driving of organic light-emitting elements has the same structure irrespective of a luminescent color, so that the driving characteristics of the elements can be uniformized.

In the case where different light-emitting materials are used in the organic light-emitting layers for respective luminescent colors, it is difficult to simplify the production process even when the thickness of the layer is kept constant. However, the light-emitting layer has a relatively large resistance as compared to that of any other organic compound layer, so the layer exerts a large effect of reducing a difference in driving voltage.

Figure 5:
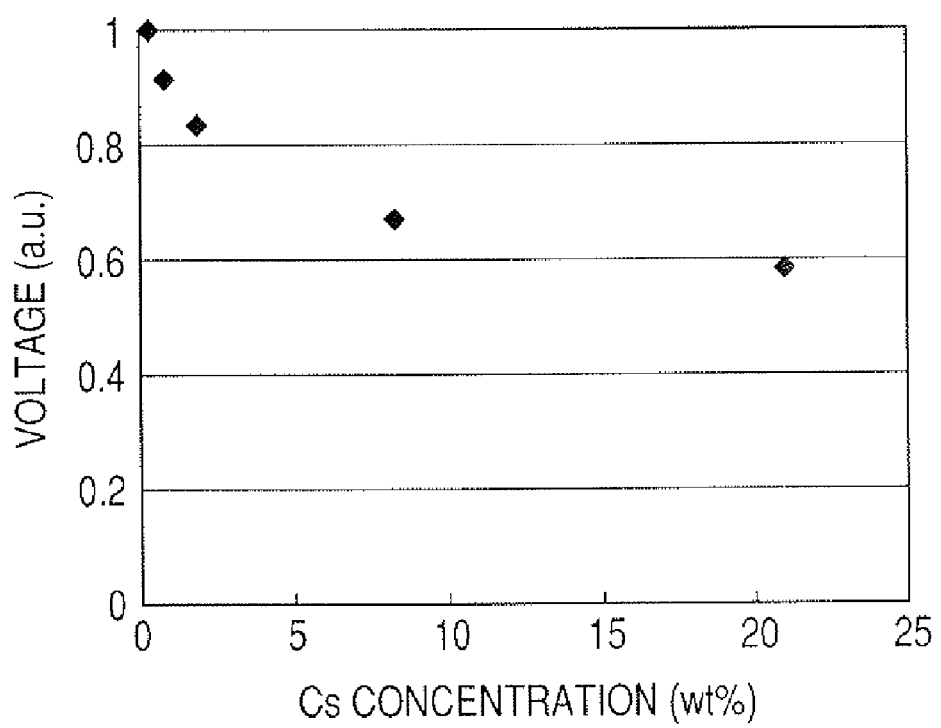
FIG. 5 is a graph showing the dependence of a voltage on a Cs concentration.

Hereinafter, the present invention will be described in accordance with examples. However, the present invention is not limited to these examples. As a result of investigation conducted by the inventor of the present invention, it has been found that the voltage or efficiency of an electron injection layer shows Cs concentration dependence. For example, FIG. 5 shows an example of data on the Cs concentration dependence of a voltage. As shown in the figure, voltage characteristics (electron injection characteristics) change with a Cs concentration. Further, upon deviation from the optimum Cs concentration (electron injection characteristics), an internal carrier balance is lost, thereby causing a reduction in efficiency occurs. The essential feature of the present invention resides in that, in an organic light-emitting device including organic light-emitting elements for emitting three color lights of red (R), green (G) and blue (B), the concentrations of an alkali metal compound are differentiated from one another corresponding to the thicknesses of respective electron injection layers of the elements in order that optimum interference conditions and optimum carrier balance conditions may be provided for the respective colors. The inventor of the present invention has determined the light-emitting characteristics of the light-emitting device of the present invention by performing numerical calculation on the basis of this finding. A driving voltage, a current density, luminance, and emission efficiency described in any one of the following examples are determined by the present inventor's numerical calculation on the basis of data on a reference experiment.

Example 1

An organic light-emitting device having a structure shown in FIG. 1 and including organic light-emitting elements for emitting three color lights of red (R), green (G) and blue (B) are produced by the following method. The chemical formulae of organic compounds to be used are shown below in this example, and Table 1 shows the thicknesses of respective layers and electrodes in red, green and blue light-emitting elements which are abbreviated as "Red", "Green" and "Blue" in Tables 1 to 10.

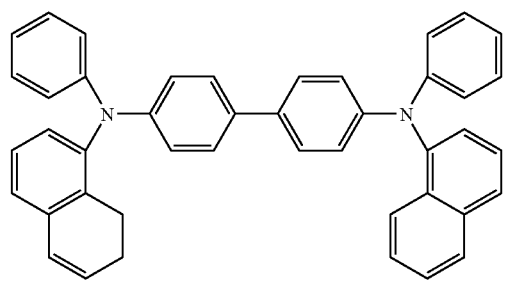

α NPD

-continued

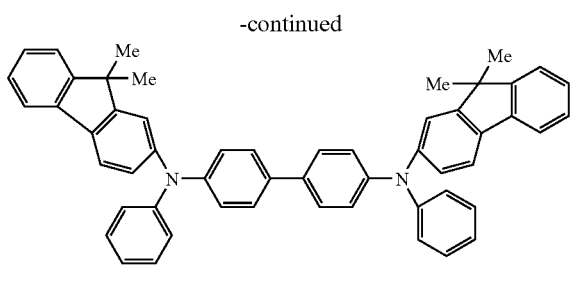

FL03

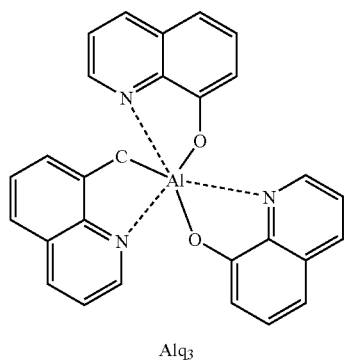

Alq₃

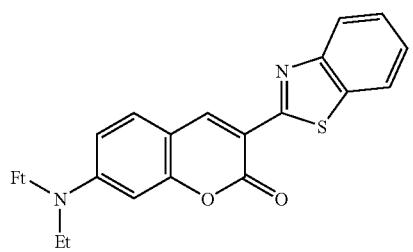

Comarin6

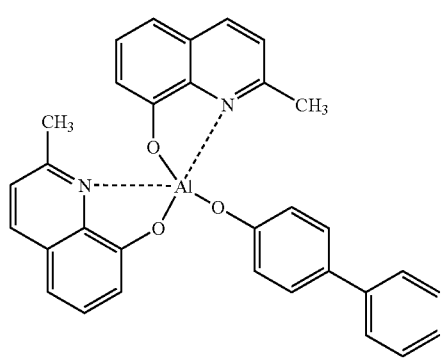

Balq

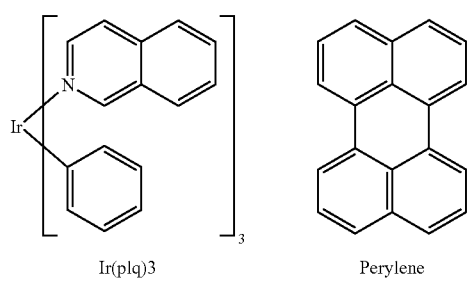

Ir(plq)3    Perylene

-continued

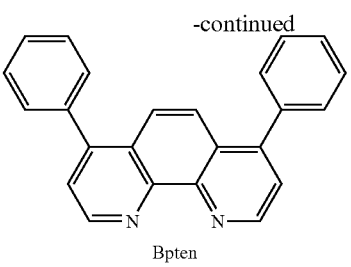

Bpten

TABLE 1

|  | Red | Green | Blue |
|---|---|---|---|
| Cathode (Al) |  | 150 nm |  |
| Electron injection layer | 30 nm | 20 nm | 10 nm |
| Electron transport layer |  | 10 nm |  |
| Light-emitting layer | 30 nm | 30 nm | 30 nm |
| Hole transport layer |  | 40 nm |  |
| Anode (ITO) |  | 120 nm |  |

The light-emitting device according to this example is the so-called bottom emission type light-emitting device in which light is extracted from the side of the transparent anode 22 as an electrode on the side of the substrate 1. Then, the light-emitting device improves light extraction efficiency by adjusting an optical distance between an interface of the organic light-emitting layer 4 and the hole transport layer 3 and an interface of the reflective cathode 71 and the electron injection layer 6.

ITO having a thickness of 120 nm is patterned by a sputtering method onto the glass substrate 1 as a support, whereby the transparent anode 22 is formed. Next, an element separation film is formed of an acrylic resin. The resultant is subjected to ultrasonic cleaning with isopropyl alcohol (IPA), subjected to boil cleaning, and it is dried. Further, the resultant is subjected to UV/ozone cleaning before an organic compound layer is formed by vacuum deposition.

First, α-NPD is formed by a vacuum deposition method into a film having a thickness of 40 nm to serve as the common hole transport layer 3. A degree of vacuum at the time of the vapor deposition is $1 \times 10^{-4}$ Pa, and a deposition rate is 0.3 nm/sec.

Next, the organic light-emitting layers 41, 42 and 43 for emitting R, G and B lights, respectively, are formed by using a shadow mask. Alq3 as a host and a luminous compound Ir(piq)3 are co-deposited (at a weight ratio of 91:9) to form an organic light-emitting layer having a thickness of 30 nm as the organic light-emitting layer 41 for emitting R light. Alq3 as a host and a luminous compound coumarin 6 are co-deposited (at a weight ratio of 99:1) to form an organic light-emitting layer having a thickness of 30 nm as the organic light-emitting layer 42 for emitting G light. Balq as a host and a luminous compound perylene are co-deposited (at a weight ratio of 90:10) to form an organic light-emitting layer having a thickness of 20 nm as the organic light-emitting layer 43 for emitting B light. A degree of vacuum at the time of the vapor deposition is $1 \times 10^{-4}$ Pa, and a deposition rate is 0.01 to 0.1 nm/sec.

Further, bathophenanthroline (Bphen) is formed by a vacuum deposition method into a film having a thickness of 10 nm to serve as the common electron transport layer 5. A degree of vacuum at the time of the vapor deposition is $1\times10^{-4}$ Pa, and a deposition rate is 0.3 nm/sec.

Next, the electron injection layers 61, 62 and 63 for R, G and B, respectively, are formed by using a shadow mask. Bphen as a host material and cesium carbonate as a dopant material of an alkali metal compound are co-deposited to form a film having a thickness of 30 nm as the electron injection layer 61 for R. A degree of vacuum at the time of the vapor deposition is $1\times10^{-4}$ Pa, the deposition rate of cesium carbonate is 0.0036 nm/sec, and the deposition rate of Bphen is 0.3 nm/sec. Bphen as a host material and cesium carbonate as a dopant material of an alkali metal compound are co-deposited to form a film having a thickness of 20 nm as the electron injection layer 62 for G. A degree of vacuum at the time of the vapor deposition is $1\times10^{-4}$ Pa, the deposition rate of cesium carbonate is 0.009 nm/sec, and the deposition rate of Bphen is 0.3 nm/sec. Bphen as a host material and cesium carbonate as a dopant material of an alkali metal compound are co-deposited to form a film having a thickness of 10 nm as the electron injection layer 63 for B. A degree of vacuum at the time of the vapor deposition is $1\times10^{-4}$ Pa, the deposition rate of cesium carbonate is 0.012 nm/sec, and the deposition rate of Bphen is 0.3 nm/sec.

In the above production, a deposition rate and a thickness are each measured with the thickness monitor of a quartz resonator; with regard to an electron injection layer, a single film is separately formed on a silicon wafer under the same conditions as those of the electron injection layer in the above production; and a cesium ion concentration is determined from ICP-MS analysis. Cesium concentrations in the electron injection layers for R, G and B are 3.5 wt %, 8.3 wt % and 10.4 wt %, respectively.

Next, aluminum (Al) is formed into a film having a thickness of 150 nm to serve as the reflective cathode 71. After the formation of the cathode 71, the resultant is sealed with a glass cap containing a desiccant in a glove box in a nitrogen atmosphere, whereby an organic light-emitting device is formed.

The light-emitting characteristics of the light-emitting elements for emitting R, G and B lights were calculated by applying a DC voltage to the organic light-emitting device thus obtained. Table 2 shows the calculated results. The R light-emitting element shows the following light-emitting characteristics at an applied voltage of 4.2 V: a current density of 20.6 mA/cm$^2$, a luminance of 2,013 cd/m$^2$, and an emission efficiency of 9.8 cd/A. The G light-emitting element shows the following light-emitting characteristics at an applied voltage of 3.6 V: a current density of 23.4 mA/cm$^2$, a luminance of 2,520 cd/m$^2$, and an emission efficiency of 10.8 cd/A. The B light-emitting element shows the following light-emitting characteristics at an applied voltage of 4.1 V: a current density of 41.8 mA/cm$^2$, a luminance of 620 cd/m$^2$, and an emission efficiency of 1.5 cd/A.

TABLE 2

|  | Red | Green | Blue |
| --- | --- | --- | --- |
| Driving voltage (v) | 4.2 | 3.6 | 4.1 |
| Current density (A/cm$^2$) | 20.6 | 23.4 | 41.8 |
| Luminance (cd/cm$^2$) | 2013 | 2520 | 620 |
| Emission efficiency (cd/A) | 9.8 | 10.8 | 1.5 |

Comparative Example 1

Figure 3:
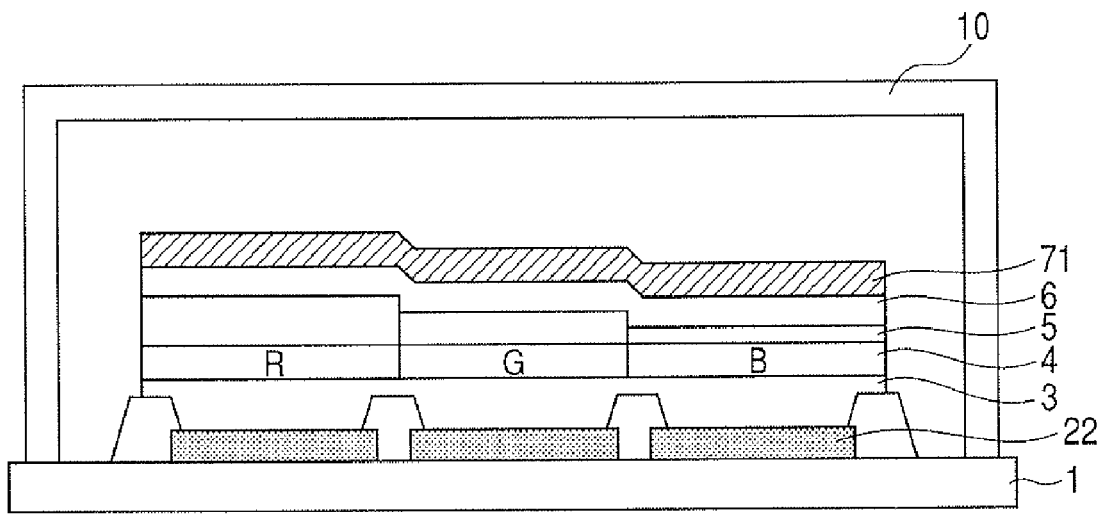
FIG. 3 is a schematic sectional view of an organic light-emitting device according to Comparative Example 1 of the present invention.

In this comparative example, the thicknesses of the respective electron transport layers for R, G and B are differentiated from one another corresponding to the respective colors. FIG. 3 shows the constitution of this comparative example, and Table 3 shows the thicknesses of respective layers and electrodes in R, G and B light-emitting elements.

TABLE 3

|  | Red | Green | Blue |
| --- | --- | --- | --- |
| Cathode (Al) |  | 150 nm |  |
| Electron injection layer |  | 10 nm |  |
| Electron transport layer | 30 nm | 20 nm | 10 nm |
| Light-emitting layer | 30 nm | 30 nm | 30 nm |
| Hole transport layer |  | 40 nm |  |
| Anode (ITO) |  | 120 nm |  |

An organic light-emitting device is produced in the same manner as in Example 1 except that: the thicknesses of electron transport layers 51, 52 and 53 for R, G and B are set to 30 nm, 20 nm, and 10 nm, respectively; and the common electron injection layer 6 is used. The thickness and cesium concentration of the electron injection layer 6 are set to 10 nm and 10.4 wt %, respectively.

The light-emitting characteristics of the light-emitting elements for emitting R, G and B lights were calculated by applying a DC voltage in the same manner as in Example 1. Table 4 shows the calculated results. The R light-emitting element shows the following light-emitting characteristics at an applied voltage of 5.1 V: a current density of 20.2 mA/cm$^2$, a luminance of 1,710 cd/m$^2$, and an emission efficiency of 8.5 cd/A. The G light-emitting element shows the following light-emitting characteristics at an applied voltage of 4.5 V: a current density of 23.2 mA/cm$^2$, a luminance of 2,302 cd/m$^2$, and an emission efficiency of 9.9 cd/A. The B light-emitting element shows the following light-emitting characteristics at an applied voltage of 4.1 V: a current density of 41.8 mA/cm$^2$, a luminance of 620 cd/m$^2$, and an emission efficiency of 1.5 cd/A.

The case where only the thicknesses of electron transport layers for the respective colors are differentiated from one another show an increase in driving voltage of the element and a reduction in efficiency as compared to Example 1 in which the thicknesses of the electron injection layers and the concentrations of the alkali metal compound are differentiated from one another corresponding to the respective colors.

TABLE 4

|  | Red | Green | Blue |
| --- | --- | --- | --- |
| Driving voltage (v) | 5.1 | 4.5 | 4.1 |
| Current density (A/cm$^2$) | 20.2 | 23.2 | 41.8 |
| Luminance (cd/cm$^2$) | 1710 | 2302 | 620 |
| Emission efficiency (cd/A) | 8.5 | 9.9 | 1.5 |

Comparative Example 2

In this comparative example, the thicknesses of the respective electron injection layer for R, G and B are differentiated from one another corresponding to the respective colors, but a cesium concentration in the electron injection layer is kept constant.

An organic light-emitting device is produced in the same manner as in Example 1 except that: the thicknesses of the electron injection layers 6 for R, G and B are set to 30 nm, 20 nm, and 10 nm, respectively; and a cesium concentration in the layer is kept constant at 3.5 wt %.

The light-emitting characteristics of the respective light-emitting elements for emitting R, G and B lights were calculated by applying a DC voltage in the same manner as in Example 1. Table 5 shows the calculated results. The R light-emitting element shows the following light-emitting characteristics at an applied voltage of 4.2 V: a current density of 20.6 mA/cm$^2$, a luminance of 2,013 cd/m$^2$, and an emission efficiency of 9.8 cd/A. The G light-emitting element shows the following light-emitting characteristics at an applied voltage of 4.2 V: a current density of 23.0 mA/cm$^2$, a luminance of 2,403 cd/m$^2$, and an emission efficiency of 10.4 cd/A. The B light-emitting element shows the following light-emitting characteristics at an applied voltage of 4.6 V: a current density of 41.0 mA/cm$^2$, a luminance of 480 cd/m$^2$, and an emission efficiency of 1.1 cd/A.

The case where only the thicknesses of electron transport layers are differentiated from one another corresponding to the respective colors shows an increase in driving of the element and a reduction in efficiency as compared to Example 1 in which the thicknesses of electron injection layers and the concentrations of the alkali metal compound are differentiated from one another corresponding to the respective colors.

TABLE 5

|  | Red | Green | Blue |
| --- | --- | --- | --- |
| Driving voltage (v) | 4.2 | 4.2 | 4.6 |
| Current density (A/cm$^2$) | 20.6 | 23.0 | 41.0 |
| Luminance (cd/cm$^2$) | 2013 | 2403 | 480 |
| Emission efficiency (cd/A) | 9.8 | 10.4 | 1.1 |

Example 2

An organic light-emitting device having a structure shown in FIG. 2 and capable of emitting three lights of R, G and B is produced by the following method. Table 6 shows the thickness of the respective layers and electrodes in R, G and B light-emitting elements.

TABLE 6

|  | Red | Green | Blue |
| --- | --- | --- | --- |
| PV film |  | 1200 nm |  |
| Cathode (IZO) |  | 60 nm |  |
| Semi-transparent cathode (Ag) |  | 15 nm |  |
| Electron injection layer | 40 nm | 30 nm | 20 nm |
| Electron transport layer |  | 10 nm |  |
| Light-emitting layer | 40 nm | 30 nm | 30 nm |
| Hole transport layer |  | 20 nm |  |
| Transparent cathode (IZO) |  | 20 nm |  |
| Reflective anode (AgAuSn) |  | 100 nm |  |

The light-emitting device according to this example is the so-called top emission type light-emitting device in which light is extracted from the side of the semi-transparent cathode 73 as an electrode on a side opposite to the substrate side. Then, the light extraction efficiency of the light-emitting device is improved by adjusting an optical distance between an interface of semi-transparent 73 and the electron injection layer 6 and an interface of the reflective anode 21 and the transparent anode 22.

A silver alloy (AgAuSn) having a thickness of 100 nm is patterned as a reflective anode 21 onto the glass substrate 1 as a support by a sputtering method. Next, IZO having a thickness of 20 nm is patterned as the transparent anode 22 onto the resultant by a sputtering method. Further, an element separation film is formed of a polyimide resin. The resultant is subjected to ultrasonic cleaning with isopropyl alcohol (IPA), subjected to boil cleaning, and it is dried. Then, after the resultant is subjected to UV/ozone cleaning, an organic compound layer is formed by vacuum deposition.

First, FL03 is formed by a vacuum deposition method into a film having a thickness of 20 nm to serve as the common hole transport layer 3. A degree of vacuum at the time of the vapor deposition is 1×10$^{-4}$ Pa, and a deposition rate is 0.3 nm/sec.

Next, the organic light-emitting layers 41, 42 and 43 for emitting R, G and B lights, respectively, are formed by using a shadow mask. Alq3 as a host and a luminous compound Ir(piq)3 are co-deposited (at a weight ratio of 91:9) to form an organic light-emitting layer having a thickness of 40 nm as the organic R light-emitting layer 41. Alq3 as a host and a luminous compound coumarin 6 are co-deposited (at a weight ratio of 99:1) to form an organic light-emitting layer having a thickness of 30 nm as the organic G light-emitting layer 42. Balq as a host and a luminous compound perylene are co-deposited (at a weight ratio of 90:10) to form an organic light-emitting layer having a thickness of 30 nm as the organic B light-emitting layer 43. A degree of vacuum at the time of the vapor deposition is 1×10$^{-4}$ Pa, and a deposition rate is 0.01 to 0.1 nm/sec.

Further, bathophenanthroline (Bphen) is formed by a vacuum deposition method into a film having a thickness of 10 nm to serve as the common electron transport layer 5. A degree of vacuum at the time of the vapor deposition is 1×10$^{-4}$ Pa, and a deposition rate is 0.3 nm/sec.

Next, the electron injection layers 61, 62 and 63 for R, G and B, respectively, are formed by using a shadow mask. Bphen as a host material and cesium carbonate as a dopant material of an alkali metal compound are co-deposited to form a film having a thickness of 40 nm as the electron injection layer 61 for R. A degree of vacuum at the time of the vapor deposition is 1×10$^{-4}$ Pa, the deposition rate of cesium carbonate is 0.002 nm/sec, and the deposition rate of Bphen is 0.3 nm/sec. Bphen as a host material and cesium carbonate as a dopant material of an alkali metal compound are co-deposited to form a film having a thickness of 30 nm as the electron injection layer 62 for G. A degree of vacuum at the time of the vapor deposition is 1×10$^{-4}$ Pa, the deposition rate of cesium carbonate is 0.0036 nm/sec, and the deposition rate of Bphen is 0.3 nm/sec. Bphen as a host material and cesium carbonate as a dopant material of an alkali metal compound are co-deposited to form a film having a thickness of 20 nm as the electron injection layer 63 for B. A degree of vacuum at the time of the vapor deposition is 1×10$^{-4}$ Pa, the deposition rate of cesium carbonate is 0.009 nm/sec, and the deposition rate of Bphen is 0.3 nm/sec.

In the above production, a deposition rate and a thickness are each measured with the thickness monitor of a quartz resonator; with regard to an electron injection layer, a single film is separately formed on a silicon wafer under the same conditions as those of the electron injection layer in the above production; and a cesium ion concentration is determined from ICP-MS analysis. Cesium concentrations in the electron injection layers for R, G and B are 1.9 wt %, 3.5 wt %, and 8.3 wt %, respectively.

Next, silver (Ag) having a thickness of 15 nm is formed into a semi-transparent cathode 73. Further, IZO is formed by a sputtering method into a film having a thickness of 60 nm to serve as a transparent cathode 72. After the formation of the cathode, silicon nitride is formed into a film having a thickness of 1,200 nm to serve as a passivation (PV) layer 8 in order that an organic light-emitting element may be protected from moisture or the like. Subsequently, an acrylic resin having a thickness of 500 µm as the resin layer 9 is bonded onto the PV layer 8, and the glass plate 10 having a thickness of 700 µm is bonded onto the resin layer 9, whereby an organic light-emitting device is formed.

The light-emitting characteristics of R, G and B light-emitting elements were calculated by applying a DC voltage to the organic light-emitting device thus obtained. Table 7 shows the calculated results. The R light-emitting element shows the following light-emitting characteristics at an applied voltage of 4.4 V: a current density of 20.3 mA/cm$^2$, a luminance of 2,071 cd/m$^2$, and an emission efficiency of 10.2 cd/A. The G light-emitting element shows the following light-emitting characteristics at an applied voltage of 3.8 V: a current density of 23.1 mA/cm$^2$, a luminance of 2,680 cd/m$^2$, and an emission efficiency of 11.6 cd/A. The B light-emitting element shows the following light-emitting characteristics at an applied voltage of 4.2 V: a current density of 42 mA/cm$^2$, a luminance of 756 cd/m$^2$, and an emission efficiency of 1.8 cd/A.

TABLE 7

|  | Red | Green | Blue |
| --- | --- | --- | --- |
| Driving voltage (v) | 4.4 | 3.8 | 4.2 |
| Current density (A/cm$^2$) | 20.3 | 23.1 | 42.0 |
| Luminance (cd/cm$^2$) | 2071 | 2680 | 756 |
| Emission efficiency (cd/A) | 10.2 | 11.6 | 1.8 |

Comparative Example 3

Figure 4:
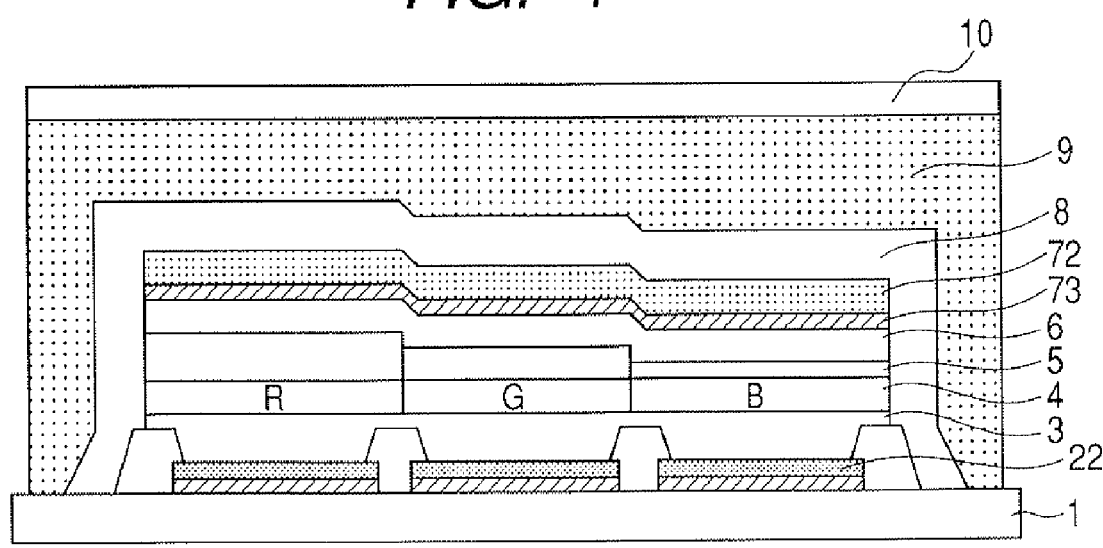
FIG. 4 is a schematic sectional view of an organic light-emitting device according to Comparative Example 3 of the present invention.

In this comparative example, the thicknesses of the respective electron transport layers for R, G and B are differentiated from one another corresponding to the respective colors. FIG. 4 shows the constitution of this comparative example, and Table 8 shows the thickness of each layer.

TABLE 8

|  | Red | Green | Blue |
| --- | --- | --- | --- |
| PV film |  | 1200 nm |  |
| Cathode (IZO) |  | 60 nm |  |
| Semi-transparent cathode (Ag) |  | 15 nm |  |
| Electron injection layer |  | 20 nm |  |
| Electron transport layer | 30 nm | 20 nm | 10 nm |
| Light-emitting layer | 40 nm | 30 nm | 30 nm |
| Hole transport layer |  | 20 nm |  |
| Transparent cathode (IZO) |  | 20 nm |  |
| Reflective anode (AgAuSn) |  | 100 nm |  |

An organic light-emitting device is produced in the same manner as in Example 2 except that: the thicknesses of electron transport layers 51, 52 and 53 for R, G and B, respectively, are set to 30 nm, 20 nm, and 20 nm; and the common electron injection layer 6 is used. The thickness and cesium concentration of the electron injection layer 6 are set to 10 nm and 8.3 wt %, respectively.

The light-emitting characteristics of the R, G and B light-emitting elements were calculated by applying a DC voltage in the same manner as in Example 2. Table 9 shows the calculated results. The R light-emitting element shows the following light-emitting characteristics at an applied voltage of 5.6 V: a current density of 20.0 mA/cm$^2$, a luminance of 1,605 cd/m$^2$, and an emission efficiency of 8.0 cd/A. The G light-emitting element shows the following light-emitting characteristics at an applied voltage of 4.8 V: a current density of 22.8 mA/cm$^2$, a luminance of 2,311 cd/m$^2$, and an emission efficiency of 10.0 cd/A. The B light-emitting element shows the following light-emitting characteristics at an applied voltage of 4.2 V: a current density of 42 mA/cm$^2$, a luminance of 756 cd/m$^2$, and an emission efficiency of 1.8 cd/A.

The case where the thicknesses of only electron transport layers are differentiated from one another corresponding to the respective colors shows an increase in driving voltage of the element and a reduction in efficiency as compared to Example 2 in which the thicknesses of the electron injection layers and the concentrations of the alkali metal compound are differentiated from one another corresponding to the respective colors.

TABLE 9

|  | Red | Green | Blue |
| --- | --- | --- | --- |
| Driving voltage (v) | 5.6 | 4.8 | 4.2 |
| Current density (A/cm$^2$) | 20.0 | 22.8 | 42.0 |
| Luminance (cd/cm$^2$) | 1605 | 2311 | 756 |
| Emission efficiency (cd/A) | 8.0 | 10.0 | 1.8 |

Comparative Example 4

In this comparative example, the thicknesses of electron injection layers for R, G and B are differentiated from one another corresponding to the respective colors, but a cesium concentration in an electron injection layer is kept constant.

An light-emitting device is produced in the same manner as in Example 2 except that: the thicknesses of the electron injection layers 6 for R, G and B are set to 40 nm, 30 nm, and 20 nm, respectively; and a cesium concentration in the layer is kept constant at 1.9 wt %.

The light-emitting characteristics of the R, G and B light-emitting elements were calculated by applying a DC voltage in the same manner as in Example 2. Table 10 shows the calculated results. The R light-emitting element shows the following light-emitting characteristics at an applied voltage of 4.4 V: a current density of 20.3 mA/cm$^2$, a luminance of 2,071 cd/m$^2$, and an emission efficiency of 10.2 cd/A. The G light-emitting element shows the following light-emitting characteristics at an applied voltage of 4.2 V: a current density of 23.0 mA/cm$^2$, a luminance of 2,560 cd/m$^2$, and an emission efficiency of 11.1 cd/A. The B light-emitting element shows the following light-emitting characteristics at an applied voltage of 5.3 V: a current density of 41.5 mA/cm$^2$, a luminance of 382 cd/m$^2$, and an emission efficiency of 0.9 cd/A.

The case where only the thicknesses of electron transport layers are differentiated from one another corresponding to the respective colors shows an increase in driving voltage of the element and a reduction in efficiency as compared to Example 2 in which the thicknesses of the electron injection layers and the concentrations of the alkali metal compound are differentiated from one another corresponding to the respective colors.

TABLE 10

|  | Red | Green | Blue |
| --- | --- | --- | --- |
| Driving voltage (v) | 4.4 | 4.2 | 5.3 |
| Current density (A/cm$^2$) | 20.3 | 23.0 | 41.5 |
| Luminance (cd/cm$^2$) | 2071 | 2560 | 382 |
| Emission efficiency (cd/A) | 10.2 | 11.1 | 0.9 |

The organic light-emitting device of the present invention has potential to be utilized in, for example, a television, a personal digital assistant, a portable phone, and a monitor for a digital camera and a digital video camera.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-173250, filed Jun. 23, 2006, and 2007-144667, filed May 31, 2007 which are hereby incorporated by reference herein in their entirety.

What is claimed is:

1. An organic light-emitting device comprising:
   a substrate; and
   a plurality of organic light-emitting elements provided on the substrate, the plurality of organic light-emitting elements including a first organic light-emitting element that emits light having a first luminescent color and a second organic light-emitting element that emits light having a second luminescent color different from the first luminescent color,
   wherein the first luminescent color has a wavelength shorter than a wavelength of the second luminescent color, an order of interference of the first luminescent color is the same as an order of interference of the second luminescent color, the first and second organic light-emitting elements each comprise a sputtered cathode, an anode, an organic light-emitting layer formed between the sputtered cathode and the anode, and an electron injection layer formed between the sputtered cathode and the light-emitting layer, and the electron injection layer comprises an organic compound and an electron injection dopant material; and
   wherein a thickness of the electron injection layer in the first organic light-emitting element is thinner than a thickness of the electron injection layer in the second organic light-emitting element, and a concentration of the electron injection dopant material in the first organic light-emitting element is higher than a concentration of the electron injection dopant material in the second organic light-emitting element.

2. An organic light-emitting device according to claim 1, wherein one of the cathode and the anode in each of the first and second organic light-emitting elements has a reflective surface, and a thickness between the reflective surface and an emission position within the organic light-emitting layer in each of the first and second organic light-emitting elements is set to intensify an emitted light having the first luminescent color and an emitted light having the second luminescent color, respectively.

3. An organic light-emitting device according to claim 1, wherein one of the cathode and the anode in each of the first and second organic light-emitting elements has a reflective surface, and the other of the cathode and the anode has a semi-transparent reflective surface, and a thickness between the reflective surface and the semi-transparent reflective surface in each of the first and second organic light-emitting elements is set so as to intensify an emitted light having the first luminescent color and an emitted light having the second luminescent color, respectively.

4. An organic light-emitting device according to claim 1, wherein the plurality of organic light-emitting elements each further comprise an electron transport layer between the organic light-emitting layer and the electron injection layer, and
   a thickness of the electron transport layer of the first organic light-emitting element is equal to a thickness of the electron transport layer of the second organic light-emitting element.

5. An organic light-emitting device according to claim 1, wherein the plurality of organic light-emitting elements each further comprise a hole transport layer between the organic light-emitting layer and the anode, and a thickness of the hole transport layer of the first organic light-emitting element is equal to a thickness of the hole transport layer of the second organic light-emitting element.

6. An organic light-emitting device according to claim 1, wherein a thickness of the organic light-emitting layer of the first organic light-emitting element is equal to a thickness of the organic light-emitting layer of the second organic light-emitting element.

7. An organic light-emitting device according to claim 1, wherein the organic light-emitting device is an active matrix type organic light-emitting device, and a thin-film transistor for driving the plurality of organic light-emitting elements is formed on the substrate.

8. An organic light-emitting device according to claim 1, wherein in each of the plurality of organic light-emitting elements, the anode, the organic light-emitting layer, the electron injection layer, and the cathode are arranged in a stated order from a side of the substrate.

9. An organic light-emitting device according to claim 1, wherein the electron injection dopant material contains at least one of an alkali metal, an alkali earth metal, and a rare earth element.

10. The organic light-emitting device according to claim 1, wherein the electron injection layer of the first organic light-emitting element and the electron injection layer of the second organic light-emitting element each have a thickness from 10 nm to 40 nm.

11. An organic light-emitting device according to claim 9, wherein the electron injection dopant material contains an alkali metal compound.

12. An organic light-emitting device according to claim 11, wherein the alkali metal compound is a cesium compound.

* * * * *